United States Patent
Shiraiwa et al.

(10) Patent No.: US 10,847,401 B2
(45) Date of Patent: Nov. 24, 2020

(54) WAFER HOLDING APPARATUS AND BASEPLATE STRUCTURE

(71) Applicants: SHINKO ELECTRIC INDUSTRIES CO., LTD., Nagano (JP); TOHOKU SEIMITSU CO., LTD., Iwate (JP)

(72) Inventors: Norio Shiraiwa, Nagano (JP); Syuuichi Andou, Iwate (JP); Kenji Takatsuka, Iwate (JP); Katsuhiro Kosuga, Iwate (JP)

(73) Assignees: SHINKO ELECTRIC INDUSTRIES CO., LTD., Nagano (JP); TOHOKU SEIMITSU CO., LTD., Iwate (JP)

( * ) Notice: Subject to any disclaimer, the term of this patent is extended or adjusted under 35 U.S.C. 154(b) by 215 days.

(21) Appl. No.: 15/619,661

(22) Filed: Jun. 12, 2017

(65) Prior Publication Data

US 2017/0372934 A1 Dec. 28, 2017

(30) Foreign Application Priority Data

Jun. 27, 2016 (JP) .................... 2016-126895

(51) Int. Cl.
  *H01L 21/683* (2006.01)
  *H01L 21/67* (2006.01)
(52) U.S. Cl.
  CPC .... *H01L 21/6833* (2013.01); *H01L 21/67103* (2013.01); *H01L 21/67109* (2013.01); *H01L 21/6831* (2013.01)
(58) Field of Classification Search
  USPC ..... 118/500, 52, 612, 728–730, 69; 361/234
  See application file for complete search history.

(56) References Cited

U.S. PATENT DOCUMENTS

| 2002/0050246 A1* | 5/2002 | Parkhe ............. H01L 21/67109 118/500 |
| 2011/0000894 A1 | 1/2011 | Ishida et al. |
| 2013/0235507 A1* | 9/2013 | Aikawa ................. C04B 35/581 361/234 |

(Continued)

FOREIGN PATENT DOCUMENTS

| JP | H09-059770 | 3/1997 |
| JP | 2000-143361 | 5/2000 |
| JP | 2000-311932 | 11/2000 |

(Continued)

OTHER PUBLICATIONS

Office Action dated Aug. 20, 2019 issued with respect to the basic Japanese Patent Application No. 2016-126895 with full machine translation.

(Continued)

*Primary Examiner* — Yewebdar T Tadesse
(74) *Attorney, Agent, or Firm* — IPUSA, PLLC

(57) ABSTRACT

A wafer holding apparatus includes an electrostatic chuck configured to clamp an object, a baseplate made of aluminum and configured to support the electrostatic chuck, a water pathway portion disposed in contact with or inside the baseplate and made of a metal having higher corrosion resistance than aluminum, and a water pathway disposed inside the water pathway portion and having an entire wall surface thereof constituted by the water pathway portion, wherein the baseplate and the water pathway portion are directly bonded to each other.

6 Claims, 4 Drawing Sheets

(56) References Cited

U.S. PATENT DOCUMENTS

2014/0103612 A1\* 4/2014 Tsutsumi .............. C04B 35/117
                                                                         279/128
2017/0140969 A1\* 5/2017 Kuo .................... H01L 21/6833

FOREIGN PATENT DOCUMENTS

| JP | 2006-156691 | 6/2006 |
| JP | 2007-227789 | 9/2007 |
| JP | 2008-205415 | 9/2008 |
| JP | 2010-052015 | 3/2010 |

OTHER PUBLICATIONS

Office Action dated Dec. 3, 2019 issued with respect to the basic Japanese Patent Application No. 2016-126895.

\* cited by examiner

WAFER HOLDING APPARATUS AND BASEPLATE STRUCTURE

CROSS-REFERENCE TO RELATED APPLICATIONS

The present application is based upon and claims the benefit of priority from the prior Japanese Patent Application No. 2016-126895 filed on Jun. 27, 2016, with the Japanese Patent Office, the entire contents of which are incorporated herein by reference.

FIELD

The disclosures herein relate to a baseplate structure, a method of making a baseplate structure, and a wafer holding apparatus.

BACKGROUND

A film deposition apparatus (e.g., a chemical vapor deposition apparatus, a physical vapor deposition apparatus, or the like) and a plasma etching apparatus are used in the process of manufacturing a semiconductor device such as an IC (integrated circuit) or an LSI (large scale integration). These apparatuses have a stage for holding a wafer in place with high accuracy in a vacuum processing chamber. An example of such a stage is a wafer holding apparatus that clamps a wafer with an electrostatic chuck mounted on a baseplate.

In the case of a wafer holding apparatus being used for a semiconductor dry etching process, the wafer is easily heated by plasma, which causes the wafer temperature to increase, resulting in an etching mask photoresist being damaged by heat or the etching shape being deteriorated. The wafer thus needs to be cooled and kept at predetermined temperature during the etching process. To this end, a water pathway may be provided inside the baseplate to control temperature (see Patent Document 1, for example).

Using a baseplate made of aluminum and a water pathway directly formed inside the aluminum body gives rise to the problem of corrosion in the wall surface of a water pathway inside the aluminum body. To avoid this, study has been made with respect to an alumite treatment applied to the wall surface of a water pathway inside the aluminum. Such a process, however, lacks sufficient reliability because alumite may break off at an edge, for example.

RELATED-ART DOCUMENTS

Patent Document

[Patent Document 1] Japanese Patent Application Publication No. 2006-156691

SUMMARY

According to an aspect of the embodiment, a wafer holding apparatus includes an electrostatic chuck configured to clamp an object, a baseplate made of aluminum and configured to support the electrostatic chuck, a water pathway portion disposed in contact with or inside the baseplate and made of a metal having higher corrosion resistance than aluminum, and a water pathway disposed inside the water pathway portion and having an entire wall surface thereof constituted by the water pathway portion, wherein the baseplate and the water pathway portion are directly bonded to each other.

A method of making a baseplate structure for use in a wafer holding apparatus having an electrostatic chuck configured to clamp an object and an aluminum baseplate configured to support the electrostatic chuck includes forming a water pathway in a water pathway portion made of a metal having higher corrosion resistance than aluminum such that an entire wall surface of the water pathway is constituted by the water pathway portion, and directly bonding the water pathway portion to the aluminum baseplate through diffusion bonding.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

Figure 1:
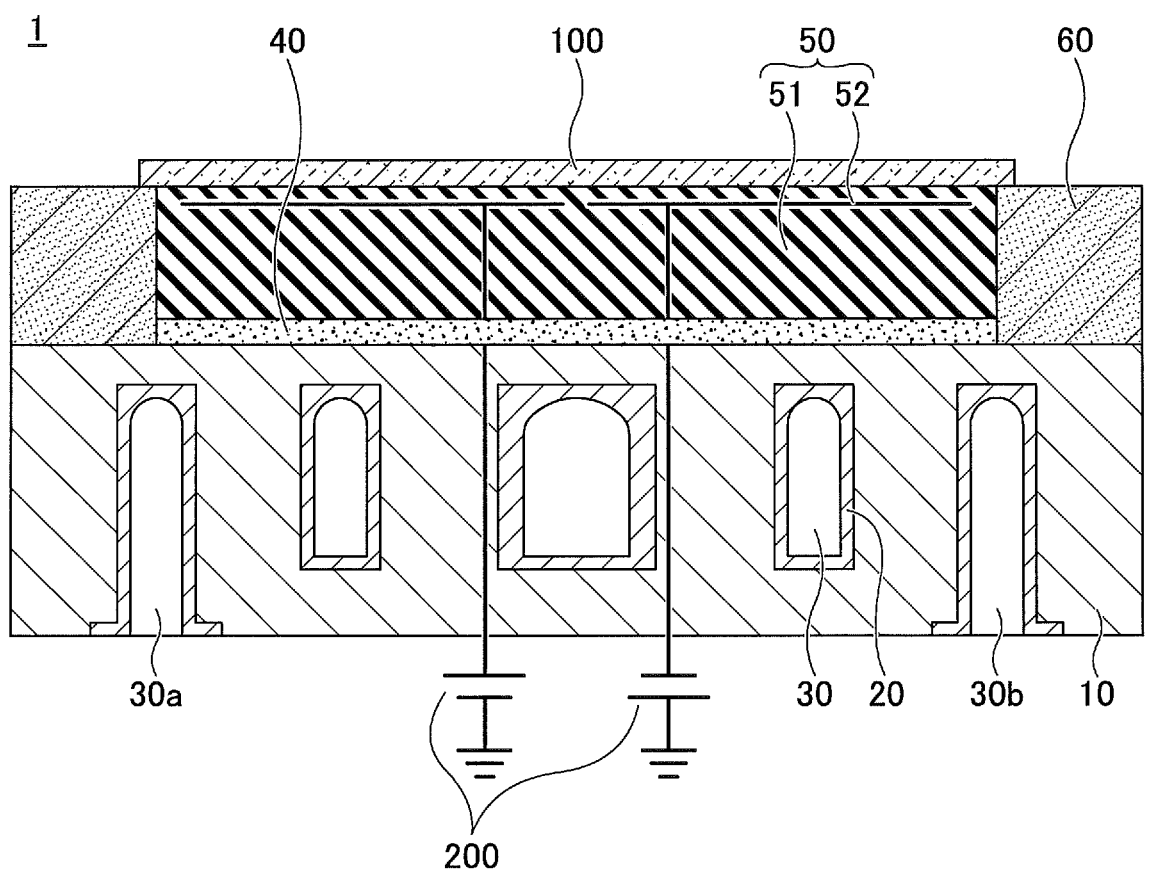
FIG. 1 is a cross-sectional view providing a schematic illustration of a wafer holding apparatus according to a first embodiment.

FIG. 1 is a cross-sectional view providing a schematic illustration of a wafer holding apparatus according to a first embodiment. As illustrated in FIG. 1, a wafer holding apparatus 1 includes a baseplate 10 and an electrostatic chuck 50 as main components. FIG. 1 illustrates a state in which the wafer holding apparatus 1 holds down an object, i.e., a wafer 100, on the electrostatic chuck 50. The diameter of the wafer 100 may approximately be 8, 12, or, 18 inches, for example.

The baseplate 10 serves to support the electrostatic chuck 50. The thickness of the baseplate 10 may approximately be 20 to 50 mm, for example. The baseplate 10 is also used as an electrode or the like for controlling plasma, and is thus made of aluminum. Supplying a predetermined amount of high-frequency electric power to the baseplate 10 enables the control of energy with which generated plasma ions impact the wafer 100, thereby achieving an efficient etching process.

The baseplate 10 has a water pathway portion 20 disposed therein. The water pathway portion 20 includes a water pathway 30 whose wall surface is provided by the water pathway portion 20. Namely, provision is made such that coolant water flowing inside the water pathway 30 does not come in contact with any portion other than the water pathway portion 20 (i.e., does not come in contact with aluminum). The water pathway 30 has a coolant-water inlet 30a at one end and a coolant-water outlet 30b at the other end. The thickness of the water pathway portion 20 (i.e., the thickness of the wall) may approximately be 1 to 3 mm. The width of the water pathway 30 may approximately be 5 to 15 mm, for example.

The water pathway portion 20 is made of a metal having higher corrosion resistance than the aluminum baseplate 10. The water pathway portion 20 may be made of stainless, copper, titanium, or the like. The aluminum of the baseplate 10 and the metal material such as stainless of the water pathway portion 20 are directly bonded to each other without an intervening brazing material.

The water pathway 30 is connected to a coolant water control apparatus (not shown) provided outside the wafer holding apparatus 1. The coolant water control apparatus (not shown) feeds coolant water into the water pathway 30 at the coolant-water inlet 30a, and receives coolant water discharged from the coolant-water outlet 30b. Circulating coolant water through the water pathway 30 to cool the baseplate 10 causes the wafer 100 to be cooled through the electrostatic chuck 50.

In addition to the water pathway 30, the baseplate 10 may further include a gas pathway for inert gas for cooling the wafer 100 and a heater for heating the wafer 100. Provision of these additional elements enables the temperature control of the wafer 100 through the electrostatic chuck 50.

The baseplate 10, the water pathway portion 20 disposed inside the baseplate 10, and the water pathway 30 formed inside the water pathway portion 20 may collectively be referred to as a baseplate structure.

The electrostatic chuck 50 is fixedly mounted on the center of the upper face of the baseplate 10 via an adhesive layer 40 made of silicone or the like having satisfactory thermal conductivity. The electrostatic chuck 50 includes a support base 51 and an electrostatic electrode 52. The electrostatic chuck 50 may be a Johnsen-Rahbeck electrostatic chuck. The electrostatic chuck 50 may alternatively be a Coulomb-type electrostatic chuck.

The support base 51 may be made of dielectric material such as ceramics of aluminum oxide ($Al_2O_3$), aluminum nitride (AlN), or the like. The thickness of the support base 51 may be in a range of approximately 1 to 10 mm. The relative permittivity of the support base 51 at 1 KHz may be in a range of approximately 9 to 10.

The electrostatic electrode 52 is a thin-film electrostatic chuck that is embedded in the support base 51. The electrostatic electrode 52 is coupled to a direct-current power supply (not shown) provided outside the wafer holding apparatus 1. Upon receiving a predetermined voltage, the electrostatic electrode 12 generates an electrostatic-based clamping force with respect to the wafer 100, thereby causing the wafer 100 to be held down on the wafer 100. The clamping force increases as the voltage applied to the electrostatic electrode 52 increases. The electrostatic electrode 52 may have either a monopole structure or a dipole structure. Tungsten, molybdenum, or the like may be used as the material of the electrostatic electrode 52.

A focus ring 60 is disposed to surround the electrostatic chuck 50 on the periphery of the upper face of the baseplate 10. The focus ring 60, which serves to protect the aluminum of the upper face of the baseplate 10 from being exposed to plasma, may be made of glass or ceramics, for example.

Figure 2:
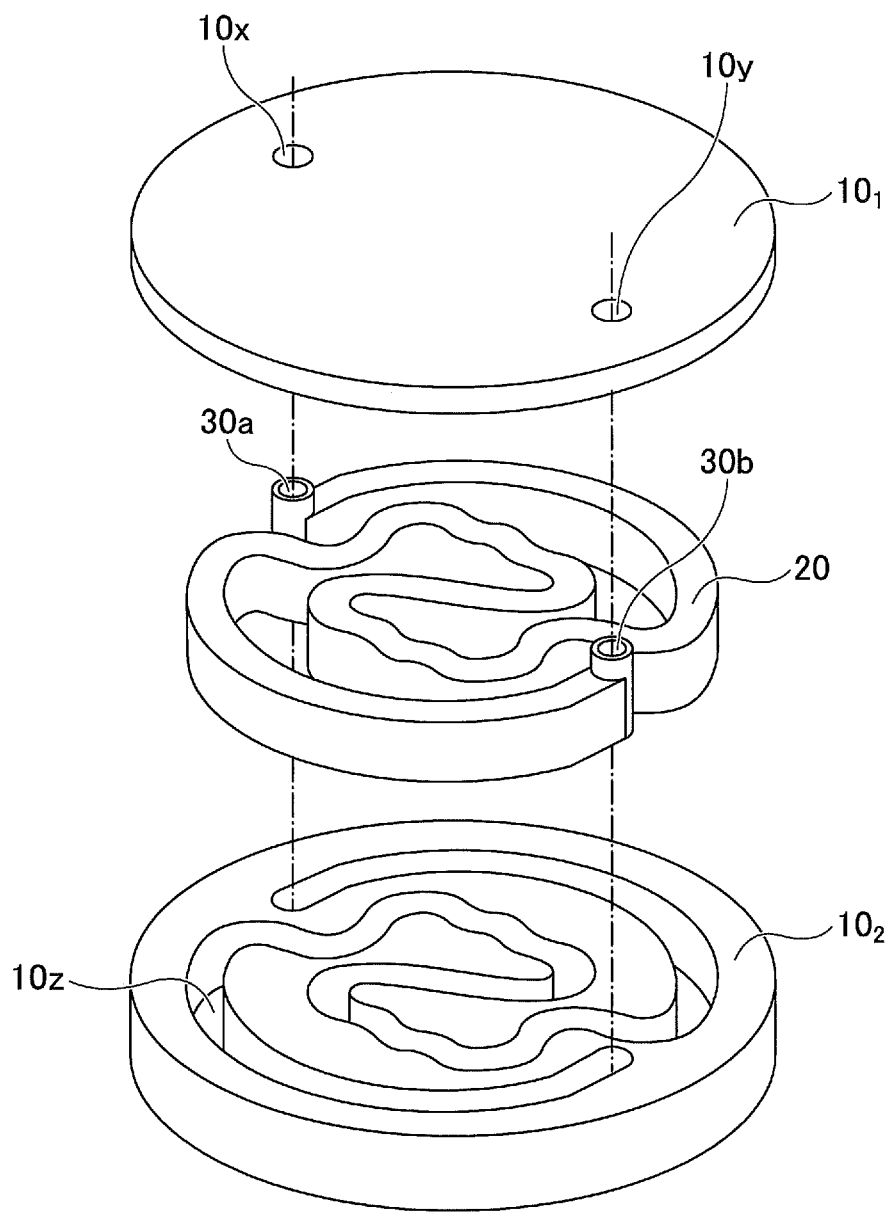
FIG. 2 is an axonometric view of a baseplate of the first embodiment before being assembled.

FIG. 2 is an axonometric view of the baseplate of the first embodiment before being assembled, illustrating the baseplate 10 to which the water pathway portion 20 is not yet bonded. It may be noted that each element in FIG. 2 is illustrated upside down relative to the position of the baseplate 10 illustrated in FIG. 1.

The baseplate 10 is made by bonding a first member $10_1$ and a second member $10_2$ to each other with the water pathway portion 20 placed therebetween.

The first member $10_1$, which is a circular member, has a through hole 10x at the position corresponding to the coolant-water inlet 30a and a through hole 10y at the position corresponding to the coolant-water outlet 30b. The first member $10_1$ may be made by numerical control machining, for example.

The second member $10_2$, which is a circular member thicker than the first member $10_1$ and having substantially the same diameter as the first member $10_1$, has a weaving groove 10z with a bottom face which corresponds in shape to the water pathway portion 20 for receiving the water pathway portion 20. The second member $10_2$ may be made by numerical control machining, for example.

The baseplate 10 may be made by diffusion bonding such as hot isostatic pressing (HIP), for example. Diffusion bonding is a bonding technique that brings two materials in contact with each other, and applies pressure causing as less plastic deformation as possible at an elevated temperature lower than the melting temperature of the materials, thereby causing atoms to be diffused at the bonded surfaces.

In order to manufacture the baseplate 10 by use of HIP, the water pathway portion 20 is first embedded into the groove 10z of the second member $10_2$. The first member $10_1$ is then placed on the second member $10_2$, followed by application of heat and pressure in vacuum for bonding. In so doing, pressure is not only applied in a vertical direction, but may need to be applied from multiple directions (i.e., equal pressure needs to be applied from all the directions).

In the case of aluminum (A6061) being used for the first member $10_1$ and the second member $10_2$ and stainless (SUS316L) being used for the water pathway portion 20, the elevated temperature may approximately be 400 to 550 degrees Celsius, and the pressure may be 0.5 to 1.0 t/cm².

The first member $10_1$ and the second member $10_2$ welded together by HIP are consolidated without a surface boundary (i.e., in a completely gapless manner) and directly bonded to each other. Similarly, the water pathway portion 20 and each of the first member $10_1$ and the second member $10_2$ are consolidated without a surface boundary (i.e., in a completely gapless manner), so that the baseplate 10 and the outer walls of the water pathway portion 20 are directly bonded.

The reason why no surface boundary is formed at the joint between the baseplate 10 and the water pathway portion 20 is that HIP causes the aluminum of the baseplate 10 and the metal of the water pathway portion 20 to be diffused with each other at the joint between the two materials to achieve atomic-level bonding.

The water pathway portion 20 having the water pathway 30 may be formed by making the upper half and lower half of the water pathway portion 20 as shown in FIG. 2 by NC processing or the like, followed by directly bonding the two halves to each other by HIP similarly to the manner described above. This arrangement enables the water pathway portion 20 having the water pathway 30 therein to be formed without a surface boundary. It may be noted, however, that the method of forming the water pathway portion 20 having the water pathway 30 therein is not limited to diffusion bonding such as HIP.

As described above, the wafer holding apparatus 1 of the first embodiment is configured such that a water pathway is not directly formed inside the aluminum baseplate 10, but the water pathway portion 20 having the water pathway 30 therein is formed inside the baseplate 10. In this configuration, metal having higher corrosion resistance than aluminum is used as the material of the water pathway portion 20, and the baseplate 10 and the water pathway portion 20 are bonded directly to each other by diffusion bonding.

This ensures that the baseplate 10 and the water pathway portion 20 having the water pathway 30 therein be consolidated without a surface boundary, thereby enabling a reliable water pathway 30 to be formed inside the aluminum baseplate 10.

The use of the water pathway portion 20 made of metal having higher corrosion resistance than aluminum to form the wall of the water pathway ensures that coolant water flowing inside the water pathway 30 be prevented from being in contact with any portions other than the water pathway portion 20 (i.e., in contact with aluminum). As a result, corrosion of the aluminum caused by coolant water is prevented.

Second Embodiment

The second embodiment is directed to an example of a wafer holding apparatus having a different structure than the first embodiment. In connection with the second embodiment, a description of the same or similar constituent elements as those of the previously provided descriptions may be omitted as appropriate.

Figure 3:
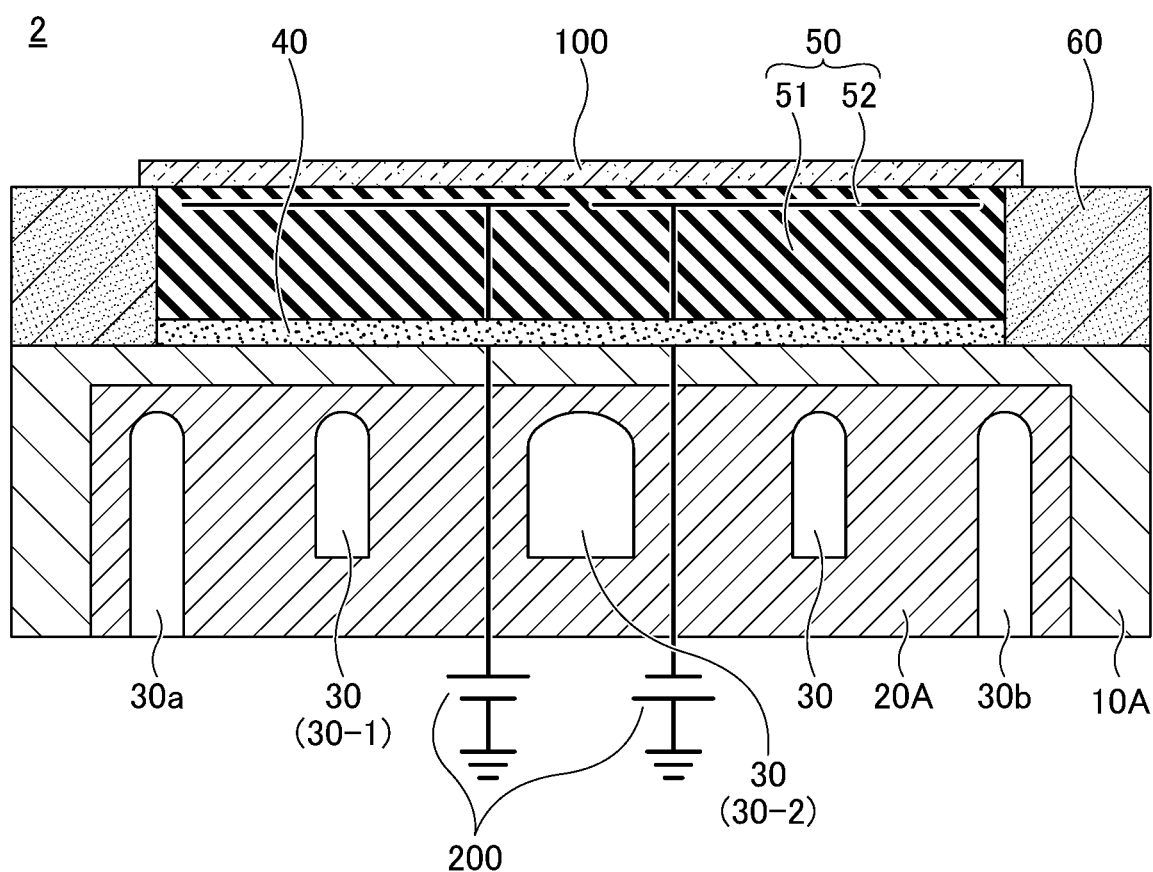
FIG. 3 is a cross-sectional view providing a schematic illustration of a wafer holding apparatus according to a second embodiment.

FIG. 3 is a cross-sectional view providing a schematic illustration of a wafer holding apparatus according to a second embodiment. A wafer holding apparatus 2 illustrated in FIG. 3 differs from the wafer holding apparatus 1 (see FIG. 1) in that the baseplate 10 and the water pathway portion 20 are replaced with a baseplate 10A and a water pathway portion 20A.

In the wafer holding apparatus 2, the baseplate 10A has a water pathway portion 20A disposed therein. More specifically, the baseplate 10A has a cylindrical recess having a downward opening, in which a disk-shaped water pathway portion 20A is embedded. The water pathway portion 20A includes a water pathway 30 whose wall surface is provided by the water pathway portion 20A. Namely, provision is made such that coolant water flowing inside the water pathway 30 does not come in contact with any portion other than the water pathway portion 20A (i.e., does not come in contact with aluminum). The water pathway portion 20A includes at least two pathway sections 30-1 and 30-2 that are part of the water pathway 30.

The water pathway portion 20A is made of a metal having higher corrosion resistance than the aluminum baseplate 10A. The water pathway portion 20A may be made of stainless, copper, titanium, or the like. The aluminum of the baseplate 10A and the metal material such as stainless of the water pathway portion 20A are directly bonded to each other by diffusion bonding such as HIP.

Since high-frequency electric power is applied to the baseplate 10A similarly to the case of the baseplate 10, an aluminum portion needs to be provided on the side facing the electrostatic chuck 50. Because of this, a metal such as stainless cannot be used for the entirety of the baseplate 10A.

Similarly to the wafer holding apparatus 1, the wafer holding apparatus 2 is configured such that the baseplate 10A and the water pathway portion 20A having the water pathway 30 therein are consolidated without a surface boundary, thereby enabling a reliable water pathway 30 to be formed inside the aluminum baseplate 10A.

The use of the water pathway portion 20A made of metal having higher corrosion resistance than aluminum to form the wall of the water pathway 30 ensures that coolant water flowing inside the water pathway 30 be prevented from being in contact with any portions other than the water pathway portion 20A (i.e., in contact with aluminum). As a result, corrosion of the aluminum caused by coolant water is prevented.

The baseplate 10A, the water pathway portion 20A formed inside the baseplate 10A, and the water pathway 30 formed inside the water pathway portion 20A may collectively be referred to as a baseplate structure.

Third Embodiment

The third embodiment is directed to another example of a wafer holding apparatus having a different structure than the first embodiment. In connection with the third embodiment, a description of the same or similar constituent elements as those of the previously provided descriptions may be omitted as appropriate.

Figure 4:
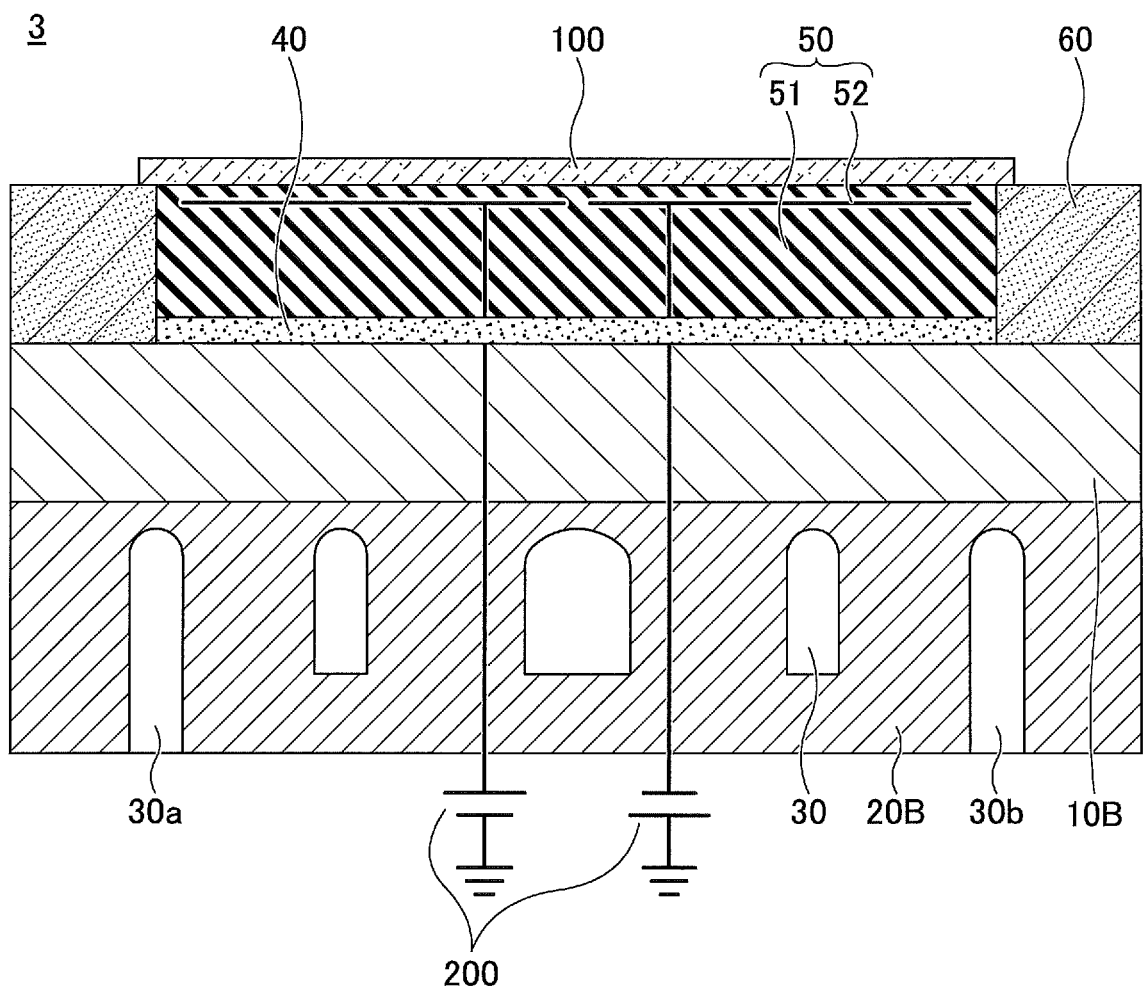
FIG. 4 is a cross-sectional view providing a schematic illustration of a wafer holding apparatus according to a third embodiment.

FIG. 4 is a cross-sectional view providing a schematic illustration of a wafer holding apparatus according to a third embodiment. A wafer holding apparatus 3 illustrated in FIG. 4 differs from the wafer holding apparatus 1 (see FIG. 1) in that the baseplate 10 and the water pathway portion are replaced with a baseplate 10B and a water pathway portion 20B.

The wafer holding apparatus 3 has a water pathway portion 20A disposed outside the baseplate 10B. More specifically, the baseplate 10B has a disk shape, and the water pathway portion 20B having a disk shape with substantially the same diameter as the baseplate 10B is disposed under the disk-shaped baseplate 10B. The water pathway portion 20B includes a water pathway 30 whose wall surface is provided by the water pathway portion 20B. Namely, provision is made such that coolant water flowing inside the water pathway 30 does not come in contact with any portion other than the water pathway portion 20B (i.e., does not come in contact with aluminum).

The water pathway portion 20B is made of a metal having higher corrosion resistance than the aluminum baseplate 10B. The water pathway portion 20B may be made of stainless, copper, titanium, or the like. The aluminum of the baseplate 10B and the metal material such as stainless of the water pathway portion 20B are directly bonded to each other by diffusion bonding such as HIP.

Since high-frequency electric power is applied to the baseplate 10B similarly to the case of the baseplate 10, an aluminum portion needs to be provided on the side facing the electrostatic chuck 50. Because of this, a metal such as stainless cannot be used for the entirety of the baseplate 10B.

Similarly to the wafer holding apparatus 1, the wafer holding apparatus 3 is configured such that the baseplate 10B and the water pathway portion 20B having the water pathway 30 therein are consolidated without a surface boundary, thereby enabling a reliable water pathway 30 to be formed inside the aluminum baseplate 10B.

The use of the water pathway portion 20B made of metal having higher corrosion resistance than aluminum to form the wall of the water pathway ensures that coolant water flowing inside the water pathway 30 be prevented from being in contact with any portions other than the water pathway portion 20B (i.e., in contact with aluminum). As a result, corrosion of the aluminum caused by coolant water is prevented.

The baseplate 10B, the water pathway portion 20B disposed in contact with the baseplate 10B, and the water pathway 30 formed inside the water pathway portion 20B may collectively be referred to as a baseplate structure.

According to at least one embodiment, a wafer holding apparatus provided with a sufficiently reliable water pathway formed inside an aluminum baseplate is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A wafer holding apparatus, comprising:
an electrostatic chuck configured to clamp an object;
a baseplate configured to support the electrostatic chuck on an upper side thereof, the baseplate being aluminum, the baseplate having a recess in a lower side thereof,
a water pathway portion disposed in the recess of the baseplate, the water pathway portion being a non-aluminum metal, the non-aluminum metal having higher corrosion resistance than aluminum, and
one or more water pathways disposed inside the water pathway portion, the water pathway portion including, as part of the one or more water pathways, at least two pathway sections that are arranged, side by side and separated from each other by a space, an entirety of the space being filled with the non-aluminum metal of the water pathway portion, the one or more water pathways having an entire wall surface thereof constituted by the water pathway portion,
wherein the baseplate and the water pathway portion are directly bonded to each other.

2. The wafer holding apparatus as claimed in claim 1, wherein the aluminum of the baseplate and the non-aluminum metal of the water pathway portion are diffused with each other at a joint between the baseplate and the water pathway portion.

3. The wafer holding apparatus as claimed in claim 1, wherein the non-aluminum metal of the water pathway portion is stainless, copper, or titanium.

4. A baseplate structure for use in a wafer holding apparatus having an electrostatic chuck configured to clamp an object, comprising:
a baseplate configured to support the electrostatic chuck on an upper side thereof, the baseplate being aluminum, the baseplate having a recess in a lower side thereof;
a water pathway portion disposed in the recess of the baseplate, the water pathway portion being a non-aluminum metal, the non-aluminum metal having higher corrosion resistance than aluminum; and
one or more water pathways disposed inside the water pathway portion, the water pathway portion including, as part of the one or more water pathways, at least two pathway sections that are arranged side by side and separated from each other by a space, an entirety of the space being filled with the non-aluminum metal of the water pathway portion, the one or more water pathways having an entire wall surface thereof constituted by the water pathway portion,
wherein the baseplate and the water pathway portion are directly bonded to each other.

5. The baseplate structure as claimed in claim 4, wherein the aluminum of the baseplate and the non-aluminum metal of the water pathway portion are diffused with each other at a joint between the baseplate and the water pathway portion.

6. The baseplate structure as claimed in claim 4, wherein the non-aluminum metal of the water pathway portion is stainless, copper, or titanium.

* * * * *